(12) United States Patent
Klochkov et al.

(10) Patent No.: US 11,848,172 B2
(45) Date of Patent: Dec. 19, 2023

(54) METHOD FOR MEASURING A SAMPLE AND MICROSCOPE IMPLEMENTING THE METHOD

(71) Applicant: Carl Zeiss SMT GmbH, Oberkochen (DE)

(72) Inventors: Dmitry Klochkov, Schwaebisch Gmuend (DE); Chuong Huynh, Quincy, MA (US); Thomas Korb, Schwaebisch Gmuend (DE); Alex Buxbaum, San Ramon, CA (US); Amir Avishai, Pleasanton, CA (US)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/522,167

(22) Filed: Nov. 9, 2021

(65) Prior Publication Data

US 2023/0145897 A1    May 11, 2023

(51) Int. Cl.
*H01J 37/26*    (2006.01)
*H01J 37/21*    (2006.01)
(Continued)

(52) U.S. Cl.
CPC .......... *H01J 37/265* (2013.01); *H01J 37/21* (2013.01); *H01J 37/28* (2013.01); *H01J 37/305* (2013.01); *H01J 2237/31745* (2013.01)

(58) Field of Classification Search
CPC .......... H01J 37/00; H01J 37/02; H01J 37/265; H01J 37/21; H01J 37/28; H01J 37/26;
(Continued)

(56) References Cited

U.S. PATENT DOCUMENTS

| 2009/0020698 A1* | 1/2009 | Muto | H01J 37/3056 |
| | | | 250/492.21 |
| 2009/0309022 A1* | 12/2009 | Gunji | H01J 37/28 |
| | | | 250/311 |

(Continued)

FOREIGN PATENT DOCUMENTS

| CN | 107924048 | 4/2018 | ............. G02B 21/00 |
| CN | 108398775 | 8/2018 | ............. G02B 21/24 |

(Continued)

OTHER PUBLICATIONS

The International Search Report and Written Opinion of the International Searching Authority for application PCT/EP2022/079974, dated Feb. 1, 2023.
(Continued)

*Primary Examiner* — Jason L McCormack
(74) *Attorney, Agent, or Firm* — Fish & Richardson P.C.

(57) ABSTRACT

The present invention relates to a method for measuring a sample with a microscope, the method comprising scanning the sample using a focusing plane having a first angle with respect to a top surface of the sample and computing a confidence distance based on the first angle. The method further comprises selecting at least one among a plurality of alignment markers on the sample for performing a lateral alignment of the scanning step and/or for performing a lateral alignment of an output of the scanning step. In particular, the at least one alignment marker selected at the selecting step is chosen among the alignment markers placed within the confidence distance from an intersection of the focusing plane with the top surface.

25 Claims, 5 Drawing Sheets

(51) Int. Cl.
*H01J 37/28* (2006.01)
*H01J 37/305* (2006.01)

(58) Field of Classification Search
CPC ........ H01J 37/305; H01J 37/222; H01J 37/15; H01J 37/1478; H01J 37/147; H01J 2237/31745
USPC .......................................... 250/306, 307, 311
See application file for complete search history.

(56) References Cited

U.S. PATENT DOCUMENTS

| | | |
|---|---|---|
| 2017/0045722 A1 | 2/2017 | Fretel et al. |
| 2018/0321478 A1 | 11/2018 | Gugel et al. |

FOREIGN PATENT DOCUMENTS

| | | | | |
|---|---|---|---|---|
| CN | 109839400 | 6/2019 | ........... | G01N 23/223 |
| JP | 4384275 | 12/2009 | .............. | H01J 37/22 |
| TW | 201405577 | 2/2014 | ............... | G21K 1/08 |
| WO | WO 2020/244795 | 12/2020 | ............... | G06T 7/33 |
| WO | WO 2021/180600 | 9/2021 | ............ | H01J 37/305 |

OTHER PUBLICATIONS

The Office Action and Search Report issued by the Taiwan Patent Office for Application No. TW 111139048 dated Aug. 1, 2023 (with English Translation).

Han et al., "A Fast Fiducial Marker Tracking Model for Fully Automatic Alignment in Electron Tomography," *Bioinformatics*, vol. 34, No. 5, pp. 853-863 (Oct. 23, 2017).

Lee et al., "Automated Diagonal Slice and View Solution for 3D Device Structure Analysis", *ISTFA Conference*, pp. 224-231 (Nov. 1, 2018).

Ress, et al., "Automatic Acquisition of Fiducial Markers and Alignment of Images in Tilt Series for Electron Tomography," *Journal of Electron Microscopy*, vol. 48, No. 3, pp. 277-287 (Mar. 1999).

\* cited by examiner

METHOD FOR MEASURING A SAMPLE AND MICROSCOPE IMPLEMENTING THE METHOD

TECHNICAL FIELD

The present invention generally relates to a method for measuring a sample with a microscope, and a microscope implementing said method. More specifically, the method allows for the lateral alignment of multiple scans of the sample, taken at an angle.

BACKGROUND

In various technical fields it is often necessary to examine a sample not only on its surface but also throughout its vertical depth. In some cases, this is possible by using imaging devices capable of seeing through the sample. In some cases, this is not possible, due for instance to the complexity of the sample or the materials thereof.

As an example, semiconductor devices are known in which vertical structures are implemented. The structures might be, for instance, vertical connections, transistors, capacitor plates, etc. It is often interesting to examine how those structures evolve along their vertical direction.

For instance, the vertical structures can be connection among components located at various horizontal layers of the sample. If the vertical structures have a vertical evolution other than planned, for instance if they have an angle with respect to their designed direction, there is a risk of short circuits or missed connections.

Figure 1A:
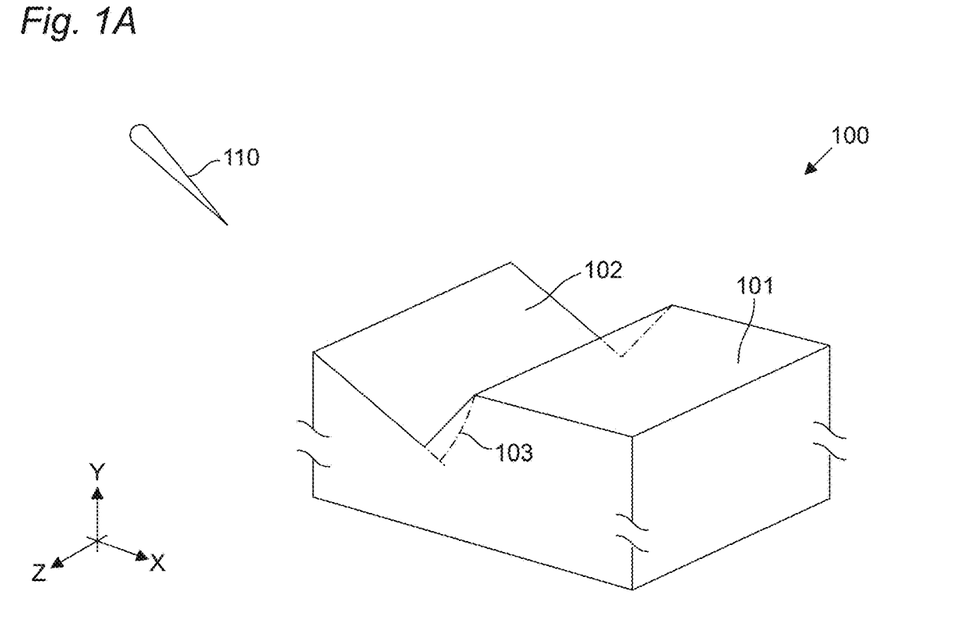
FIGS. 1A-1D schematically illustrate perspective views of a sample 100 for describing phases of a method for measuring the sample, in accordance with the state of the art.

A method that allows for such evaluation is known and is schematically illustrated in FIG. 1A. A sample 100 is provided with a top surface 101, which is usually substantially flat. A portion of the sample is milled away from the top surface 101, for instance by using a milling beam 110, such as a focused ion beam, FIB. The milling can be done at an angle 103 with respect to the top surface 101. This results in one or more slanted surfaces 102, as illustrated.

Figure 1B:
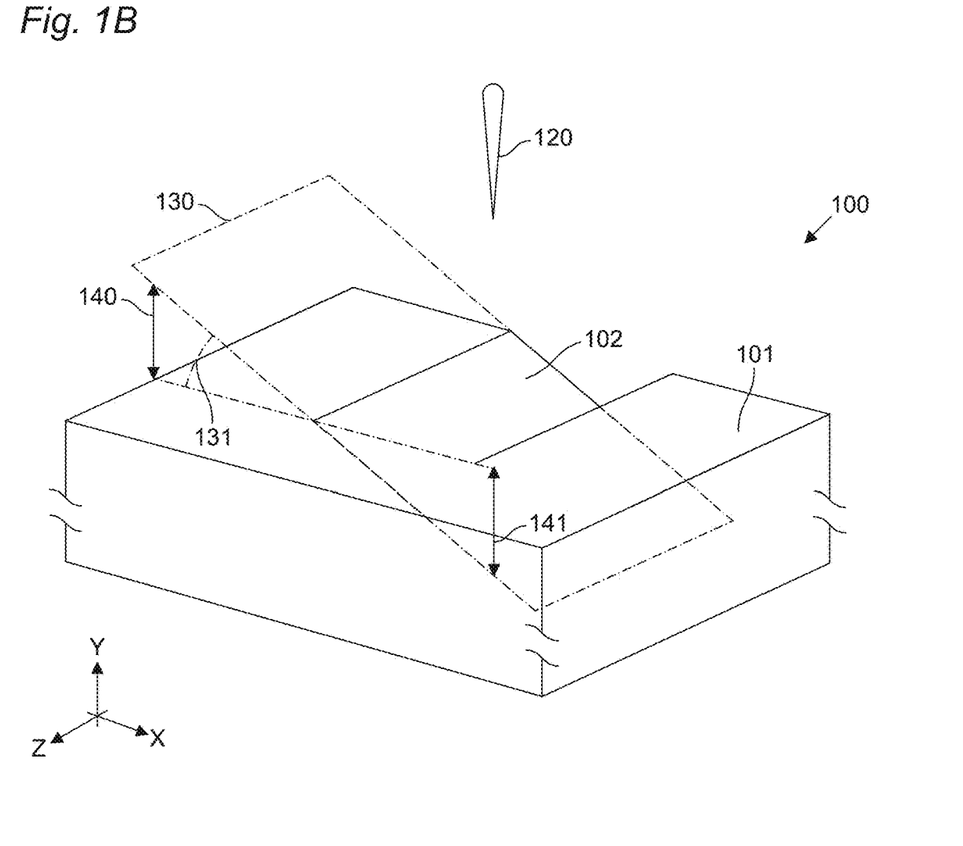

FIG. 1B schematically illustrates the same sample 100 of FIG. 1A, with a larger top surface 101 surrounding the region comprising the slanted surface 102. As visible in FIG. 1B, the sample 100 can be imaged by using a focusing plane 130 presenting an angle 131 with respect to the top surface 101. Preferably, the angle 131 is comparable, even more preferably the same, with angle 103. This allows the slanted surface 102 to be imaged with a focus that tracks the sloping orientation of the slanted surface 102. The scanning can be operated with an imaging beam 120, for instance an SEM or more generally a charged particle microscope.

Figure 1C:
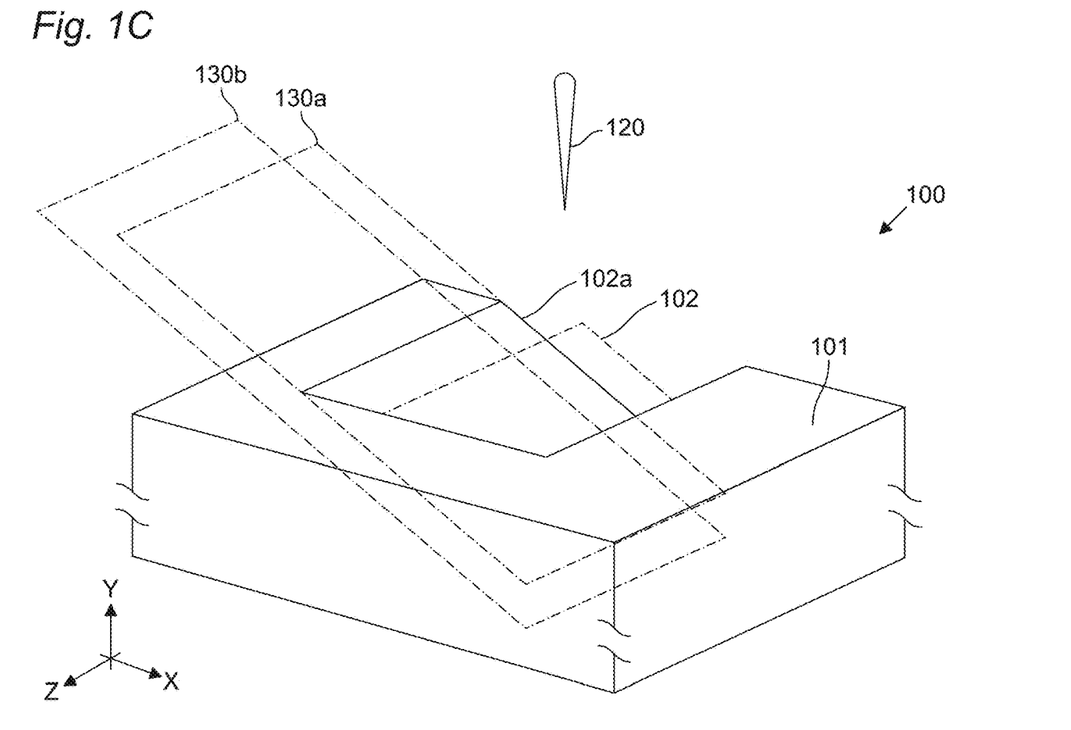

As schematically illustrated in FIG. 1C, the sample 100 can then be further milled to a further slanted surface 102a, which could be lower in the vertical direction Z than plane 102, and then subjected again to a scanning, along focusing plane 130a. A further milling can then occur, followed by a scanning along focusing plane 130b, which might also be lower than focusing plane 103a in the Z direction. In this manner, by repeating the milling and scanning steps, it is possible to realize subsequent images showing the evolution along the vertical direction Z of the vertical structures realized within sample 100.

The scanning of the sample might therefore require a plurality images being taken, along a plurality of focusing planes 130, 130a, 130b. In order to obtain a single image, or 3D model, of the sample 100, it therefore becomes necessary to combine the plurality of images together. In order to do so, it is in particular necessary to correctly align the various images with each other, and in particular in the direction parallel to the top surface 101, indicated as XZ plane in the figures.

A correct alignment of the images is important as it ensures a correct reconstruction of the evolution of the vertical structures measured in the sample 100.

Figure 1D:
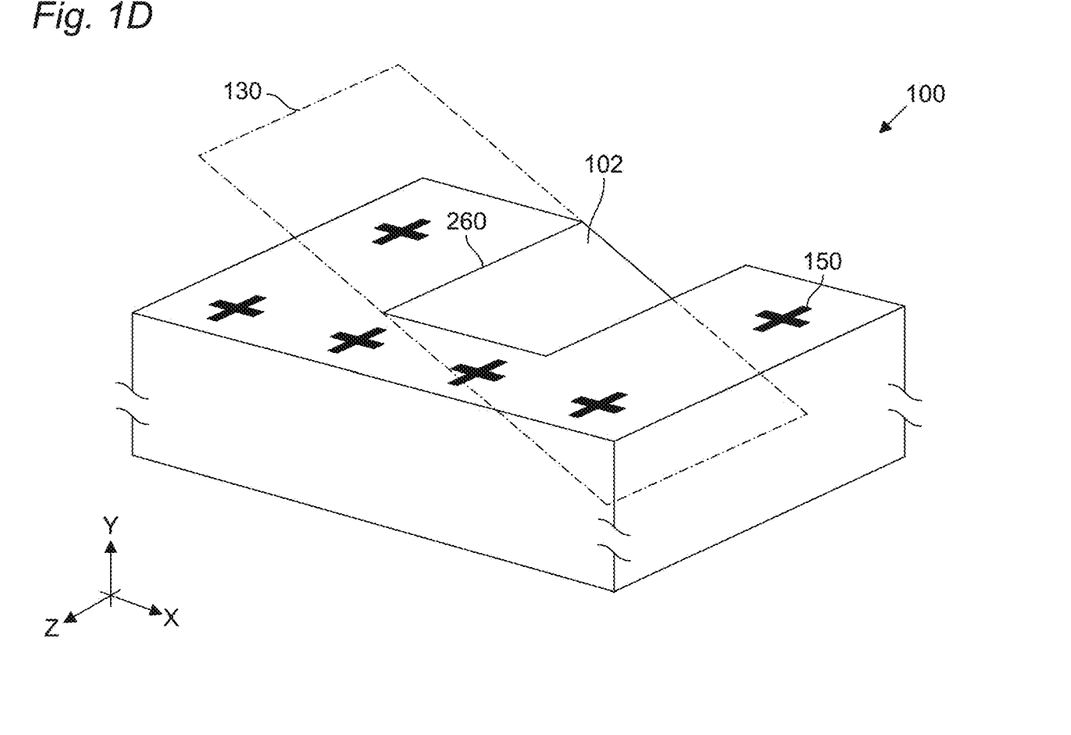

For allowing such lateral alignment, a plurality of alignment markers 150 can be implemented on top surface 101, as illustrated in FIG. 1D.

When scanning the sample along focusing plane 130, not all alignment markers 150 will be in focus. In particular, as illustrated in FIG. 1B, due to a defocusing height 140, 141 between the focusing plane 130 and the top surface 101, some of the alignment markers 150 might be too far away from the focusing plane 130 in order to be imaged with a sufficient precision for the subsequent lateral alignment. That is, the depth of field of the scanning device 120 can be smaller than the defocusing height 140, 141, at certain locations, as the height 140, 141 increases due to the slope of the focusing plane 130. Due to the reduced depth of field, some of the markers 150 might thus be placed outside of an acceptable focus of the imaging beam 120, resulting in subsequent errors during the combination of the plurality of images.

SUMMARY

There is thus a need to provide a manner for allowing the plurality of images to be correctly aligned with each other in order to enable a correct reconstruction of the image sample 100.

This need is met by the features of the independent claims. The features of the de-pendent claims define embodiments.

The invention is generally based on the concept that an alignment marker closer to the intersection of the focusing plane with the top surface of the sample will be imaged with a better focus than an alignment marker further away from the intersection. Specific aspects of the invention thus are related to how to select an appropriate alignment marker and/or how to realize the alignment markers so as to ensure that an appropriate alignment marker will be available.

An embodiment can therefore relate to a method for measuring a sample with a microscope, the method comprising the steps of: scanning the sample using a focusing plane having a first angle with respect to a top surface of the sample, computing a confidence distance based on the first angle, selecting at least one among a plurality of alignment markers on the sample for performing a lateral alignment of the scanning step and/or for performing a lateral alignment of an output of the scanning step. In particular, the at least one alignment marker can be chosen at the selecting step among the alignment markers placed within the confidence distance from an intersection of the focusing plane with the top surface.

Thanks to this arrangement, it is possible to choose an alignment marker that ensures a correct lateral alignment. One further advantage is that the alignment marker can be chosen without measuring a defocusing characteristic of the marker, which might be computationally intensive, but simply on the basis of the marker's location with respect to the intersection.

In some implementations, the first angle can be bigger than 5 degrees, preferably bigger than 15 degrees, and/or smaller than 70 degrees, preferably smaller than 50 degrees.

Thanks to this arrangement, it is possible to use the invention in a wide array of measuring ranges.

In some implementations, wherein the sample can comprise at least a region with a slanted surface, the slanted surface can have a second angle with respect to the top surface, wherein the first angle and the second angle can differ for at most 10 degrees and/or 10%.

Thanks to this arrangement, it is possible to measure the slanted surface with a focusing plane tracking the vertical evolution of the slanted surface.

In some implementations, the confidence distance can be measured in a direction perpendicular to the intersection.

In some implementations, the confidence distance can be measured in a direction parallel to the top surface.

Thanks to this arrangement, it is possible to define the region in which the alignment markers are preferably located in a computationally simple manner.

In some implementations, the step of computing the confidence distance can be based on a maximum tolerable defocusing value.

Thanks to this arrangement, the method can be adapted to operate under different precision requirements and allow selection of different alignment markers as a function of the maximum tolerable defocusing value.

In some implementations, the maximum tolerable defocusing value can be a maximum tolerable defocusing height.

Thanks to this arrangement, it is possible to easily define the maximum tolerable defocusing value based on the technical specifications of the microscope in use.

In some implementations, the step of computing can comprises computing $$\text{ConfDist}=f(\phi)$$

wherein $\phi$ is the first angle (131),

ConfDist is the confidence distance (270), f is a function which increases as $\phi$ decreases.

Thanks to this arrangement, it is possible to compute a confidence distance in a computationally simple manner.

In some implementations, the method can further comprise the step of marking the sample with one or more alignment markers.

Thanks to this arrangement, it is possible to implement the alignment markers selected at the selecting step in a manner which increases the precision of the lateral alignment and/or which reduces the number of alignment markers which are necessary for aligning the plurality of pictures.

In some implementations, the marking step can comprise realizing one or more alignment markers within the confidence distance from the intersection.

In some implementations, the marking step can comprise realizing one or more alignment markers such that a separation distance between two neighbouring alignment markers is $$D \leq 2 \times h_{MAX}/\tan(\phi)$$

wherein

D is the separation distance, $\phi$ is the first angle (131), $h_{MAX}$ is a maximum tolerable defocusing height (140, 141).

In some implementations, the marking step can comprise realizing one or more alignment markers such that a separation distance between two neighbouring alignment markers is $$D \leq 2 \times \text{ConfDist}$$

wherein

D is the separation distance,

ConfDist is the confidence distance (270).

Thanks to those arrangements, it is possible to position the alignment markers with respect to the intersection in a manner which improves the subsequent lateral alignment and/or reduces the number of necessary markers.

In some implementations, the method can further comprise the step of milling the sample so as to realize one or more slanted surfaces in the sample.

Thanks to this arrangement, a plurality of milled surfaces can implemented, preferably stepwisely with respective scanning steps, so that the sample can be scanned along its depth.

In some implementations, the milling step and the marking step can be implemented with the same component.

Thanks to this arrangement, it is possible to reduce the number of components used for implementing the method.

A further embodiment can relate to a microscope comprising a controller, and a memory, wherein the memory can store instructions configured to cause the controller to control the microscope so as to execute any of the method steps described above.

A further embodiment can relate to a software product for a microscope, the product comprising instructions configured to cause a controller to control the microscope so as to execute any of the method steps described above.

DESCRIPTION OF DRAWINGS

Throughout the description, reference is made to the figures for ease of understanding, where like reference numerals represent like elements, and in which.

DETAILED DESCRIPTION

Some examples of the present disclosure generally provide for a plurality of circuits or other electrical devices. All references to the circuits and other electrical devices and the functionality provided by each are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices can be combined with each other and/or separated in any manner based on the particular type of electrical implementation that is desired. It is recognized that any circuit or other electrical device disclosed herein can include any number of microcontrollers, a graphics processor unit (GPU), integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, any one or more of the electrical devices can be configured to execute a program code that is embodied in a non-transitory computer readable medium programmed to perform any number of the functions as disclosed.

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein can also be implemented by an indirect connection or coupling. A coupling between components can also be established over a wireless connection. Functional blocks can be implemented in hardware, firmware, software, or a combination thereof.

Figure 2A:
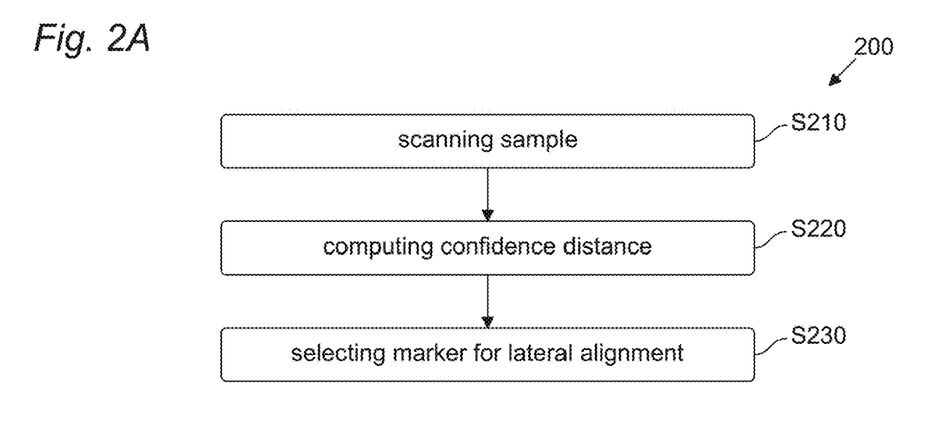
FIG. 2A schematically illustrates a method 200 for measuring a sample 100.
Figure 2B:
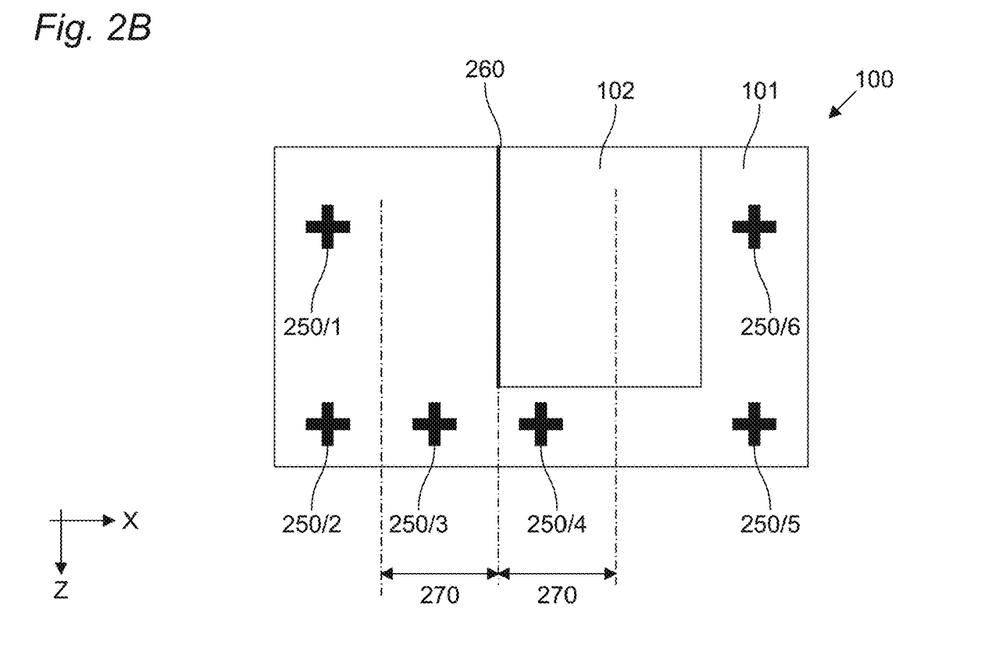
FIG. 2B schematically illustrates a top view of a sample 100.

FIG. 2A schematically illustrates a method 200 for measuring a sample 100, while FIG. 2B schematically illustrates a top view of a sample 100 for clarifying the operation of method 200.

Method 200 allows the measuring of a sample 100 with a microscope. In preferred implementations, the sample 100 can be a semiconductor sample, such as a wafer or a part thereof, which can be referred to as coupon, though the invention can be applied to any type of sample. The sample 100 can comprise a top surface 101 which is substantially flat and extending along a direction, indicated as direction XZ in the figures. In preferred implementations, the sample 100 can be positioned in the microscope such that the top surface 101 substantially corresponds to the horizontal direction, although the invention is not limited thereto. Thus, in the following, whenever reference is made it to the plane of top surface 101, this can also be understood as corresponding to the horizontal direction. In preferred implementations, the microscope can be a scanning electron microscope, SEM, an atomic force microscope, AFM, a helium-ion microscope, HIM or more generally any known type of microscope, and in particular any type of charged particle microscope.

As visible in FIG. 1D, the sample 100 can comprise at least a region with at least one slanted surface 102. The slanted surface 102 has an angle 103 with respect to the top surface 101. The angle 103 is understood to be the smaller angle formed by the intersection of the slanted surface 102 and the top surface 101.

In preferred implementations, the angle 103 can be bigger than 5 degrees, preferably bigger than 15 degrees, and/or smaller than 70 degrees, preferably smaller than 50 degrees.

In preferred implementations, the region with the one or more slanted surfaces 102 can occupy a percentage of the sample surface being bigger than 5%, preferably bigger than 10%, and/or smaller than 85%, preferably smaller than 80%.

As further visible in FIG. 1D, the remaining top surface 101 of the sample 100, for instance the part of surface of the sample 100 not occupied by the region with the slanted surfaces 102, can comprise one or more alignment markers 150.

The method 200 can comprise a step S210 of scanning the sample 100 using a focusing plane 130 having an angle 131 with respect to the top surface 101 of the sample 100. The angle 131 is understood to be the smaller angle formed by the intersection of the focusing plane 130 and the top surface 101.

In preferred implementation, the angle 131 can be bigger than 5 degrees, preferably bigger than 15 degrees, and/or smaller than 70 degrees, preferably smaller than 50 degrees.

Preferably, the angle 131 and the angle 103 differ for at most 10 degrees, preferably at most 5 degrees, and/or at most 10% of the smaller angle. In further preferred implementations, the angle 103 and 131 are substantially equal, or identical.

Thanks to this implementation, it is possible to scan the slanted surface 102 with a focusing position which tracks the evolution of the slanted surface 102, in particular along the vertical direction, indicated as direction Y in the figures, thus ensuring that the entire slanted surface 102 is imaged with a high resolution.

The method 200 can further comprise a step S220 of computing a confidence distance 270 based on the angle 131. It will be noted that, although in FIG. 2A the step S220 is indicated as being carried out after step S210, the invention is not limited thereto. In particular, in preferred implementations, the step S220 can be carried out after step S210, while in alternative preferred implementation, the step S220 can be carried out before step S210.

The purpose of the confidence distance 270, as will become clear from the following description, is to compute a distance helping in the selection of one or more appropriate alignment markers 150 ensuring a correct alignment of the plurality of images taken by the microscope. The confidence distance 270 can therefore be computed so as to define a distance from an intersection 260 of the focusing plane 130 with the top surface 101 within which the focusing capability of the microscope is considered to be sufficient for correctly imaging the alignment markers 150.

It will be clear to those skilled in the art that, in addition to taking into account the value of the angle 131, a computation of the confidence distance 270 can depend on multiple factors, such as the maximum tolerated defocusing of the alignment markers 150, which can be different for different applications, the shapes of the alignment markers 150, etc.

In preferred implementations, the confidence distance 270 can be computed as $$\text{ConfDist} = f(\phi)$$

wherein $\phi$ is the first angle (131),

ConfDist is the confidence distance (270), f is a function which increases as $\phi$ decreases, at least for a certain range of $\phi$.

In preferred implementations, the function f can comprise a trigonometric function, preferably a cosine, causing the value of f to increase as the cosine increases, preferably in a linear manner.

The method 200 can further comprise a step S230 of selecting at least one among a plurality of alignment markers 150, 250/1-250/6 on the sample 100 for performing a lateral alignment of the scanning step S210 and/or for performing a lateral alignment of an output of the scanning step S210.

That is, in some preferred implementations, the selected one or more alignment marker can be used to align a plurality of scanning steps S210, before the scanning, so that their output is automatically aligned among the plurality of scans and can thus be combined without further processing. Alternatively, or in addition, in some preferred implementation, the selected one or more alignment marker can be used to align the output of a plurality of scanning steps S210, so that the scanning steps can be performed without needing a precise lateral alignment and the resulting output images can be subsequently aligned with each other during post-processing.

It will therefore be clear that the step selecting S230 can be carried out before or after the scanning step S210. In particular, in some preferred implementations, the selecting step S230 can be carried out before the scanning step S210 to enable the alignment of the various scanning steps. Alternatively, or in addition, the selecting step S230 can be carried out after the scanning step S210 to enable the alignment of the output of the various scanning steps.

In order to enable the selection of appropriate alignment markers, the at least one alignment marker selected at the selecting step S230 can be chosen among the alignment markers 150, 250/1-250/6 placed within the confidence distance 270 from an intersection 260 of the focusing plane 130 with the top surface 101.

In particular, as visible in FIGS. 1D and 2B, the intersection of the focusing plane 130 with the top surface 101 is indicated as intersection 260, thus corresponding to a line on top surface 101. Alignment markers being placed at a distance from intersection 260 which is higher than the confidence distance 270 are not suitable for proper alignment due to their resolution being negatively impacted by the too high distance from the focusing plane 130. In FIG. 2B, this is the case, for instance, of alignment markers 250/1, 250/2, 250/5, and 250/6. Conversely, alignment markers placed within the confidence distance 270 from the intersection 260, such as alignment markers 250/3 and 250/4 are suitable and can be selected by the selecting step S230.

In this manner, the invention allows for the selection of alignment markers associated to a given scanning step S210, and a respective focusing plane 130, which can ensure a correct alignment of the plurality of images resulting from the plurality of scans.

In preferred implementations, the selecting step S230 can further comprise selecting one or more alignment markers 150 in order of their distance from the intersection 260. That is, in case a plurality of alignment markers 150 are available within the region defined by the intersection 260 and the confidence distance 270, the selecting step S230 can further select a subset of those alignment markers based on their distance from the intersection 260, starting from the alignment marker closest to the intersection 260 and/or, when more than one alignment marker is requested, selecting further alignment markers in order of their distance from the intersection 260.

In preferred implementations, the confidence distance 270 can be measured in a direction perpendicular to the intersection 260. In further preferred implementations, the confidence distance 270 can be measured in a direction parallel to the top surface 101.

In preferred implementations, the computing step S220 can be further based on a maximum tolerable defocusing value. Preferably, the maximum tolerable defocusing value can result in an upper limit on the confidence distance 270. It will be clear to those skilled in the art that a plurality of alternative manners can be considered for defining the maximum tolerable defocusing value. For instance, in some examples it can be defined as a minimum resolution needed on the alignment marker of 150. Alternatively, or in addition, in some examples it can be defined as a maximum distance from the center of the depth of field. It will be clear to those skilled in the art how the confidence distance 270 can be computed based on any given indication of the maximum tolerable defocusing value. In preferred implementations, the maximum tolerable defocusing value can be defined as a maximum tolerable defocusing height 140, 141.

Figure 2C:
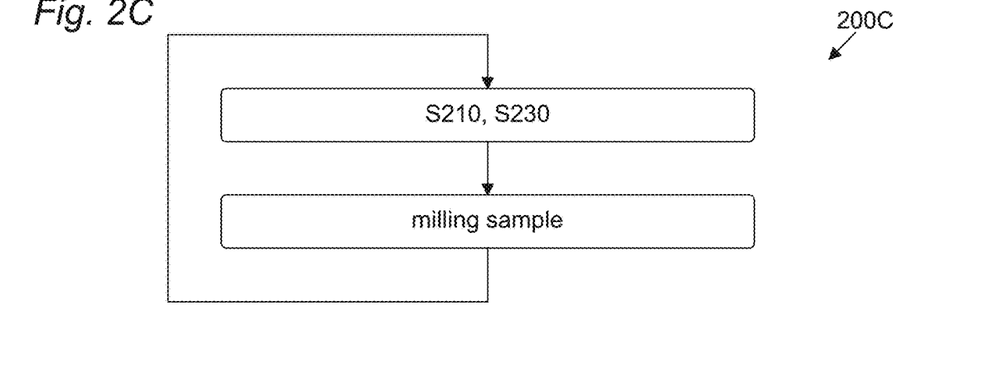
FIG. 2C schematically illustrates a method 200C for measuring a sample 100.

In some implementations a plurality of successive milling and scanning steps can thus be implemented, as illustrated in FIG. 2C.

In particular, method 200C comprises a repeated execution of two steps. In a first step, a scanning step S210 can be implemented together with the respective selection of the appropriate markers for the alignment, through selecting step S230. At a first execution of the method 200C, the first step can further comprise step S220, which, in some implementations, can be avoided at successive cycles. In a second step of method 200C a milling step is executed, so as to remove part of the sample 100 and result in a lower slanted surface 102a.

Such repeated execution of the scanning milling steps allow the sample 100 to be measured along its vertical direction Y. In some embodiments, the method 200C can execute the cycle a predetermined number of time, preferably as function of the depth which is to be reached in sample 100 and/or of the resolution needed along the vertical direction. Further preferably, after execution of the scanning and milling cycles, the method 200C can comprise a non-illustrated step of reconstructing a model of the sample 100 based on the images, where the reconstruction is based on the alignment of the images based on the alignment markers selected at the steps S130. Further preferably, after the reconstructing step, the method 200C can comprise a non-illustrated step of evaluating vertical structures within the sample 100, preferably based on the reconstructed model.

Figure 3A:
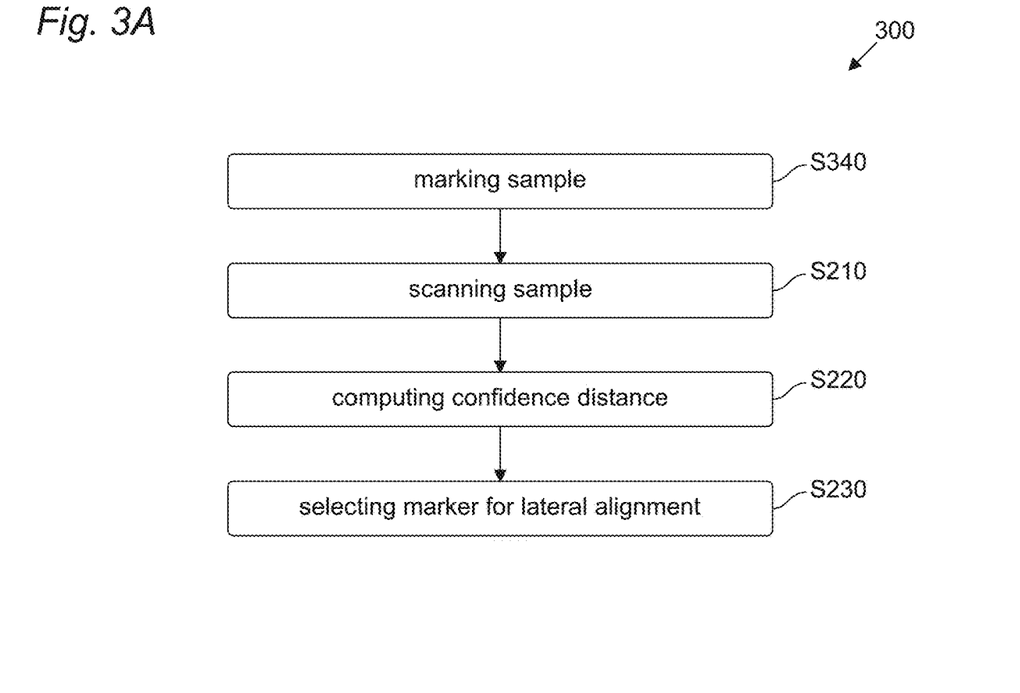
FIG. 3A schematically illustrates a method 300 for measuring a sample 100.
Figure 3B:
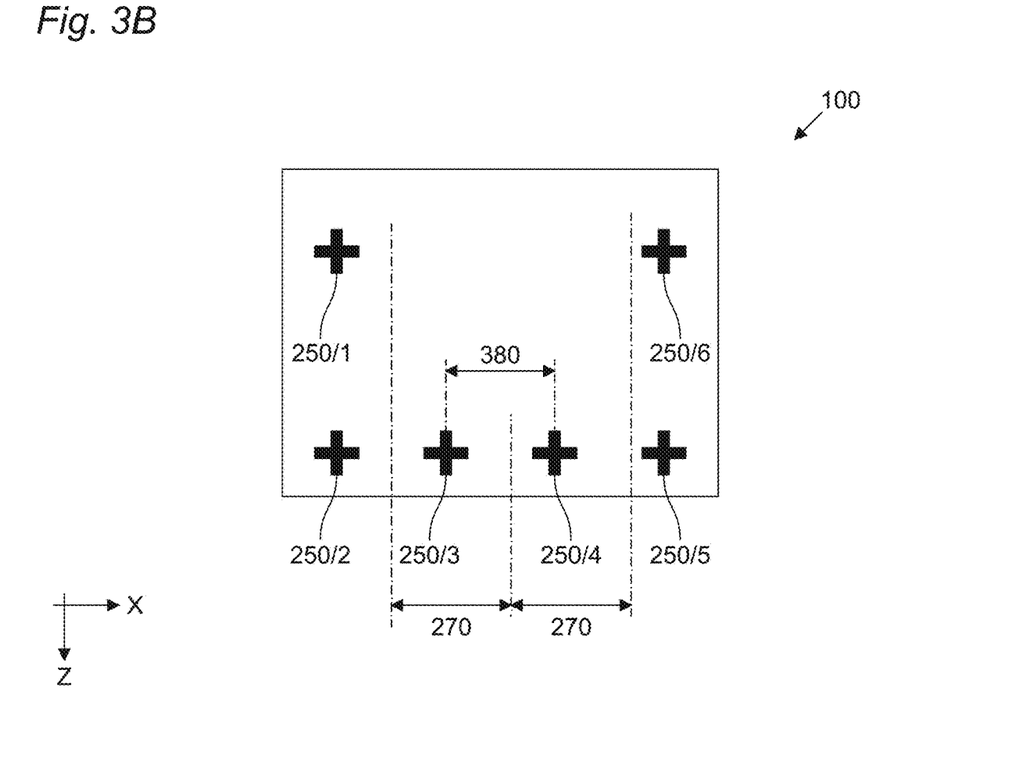
FIG. 3B schematically illustrates a top view of a sample 100.

FIG. 3A schematically illustrates a method 300 for measuring a sample 100, while FIG. 3B schematically illustrates a top view of a sample 100 for clarifying the operation of method 300.

Method 300 differs from method 200 in that it further comprises a step S340 of marking the sample 100 with one or more alignment markers 150, 250/1-250/6. Step S340 is preferably carried out before steps S210 and S230, while it can be carried before or after step S220. Method 300 is therefore particularly advantageous in that it allows the position, shape and more generally any characteristics of the alignment markers 115 to be decided based on their intended use. For instance, in some examples, in applications with a lower angle 131 of the focusing plane 130, it is possible to implement a lower number of alignment markers 150 than in applications with a higher angle 131. Thus, it can be advantageous to first set a value for the angle 131 and then execute the marking of the sample 100, so as to avoid unnecessary alignment markers 150, which require a longer processing time and thus increase costs. Moreover, as will become clear from the following description, in some examples, it is possible to use the same component for implementing the marking of the sample 100 and the milling of the slanted services 102, thus streamlining the processing of the sample 100.

In preferred implementations, the marking step S340 comprises realizing one or more alignment markers 150, 250/1-250/6 within the confidence distance 270 from the intersection 260. In this manner it can be ensured that at least one alignment markers will be available within the confidence distance 270 from the intersection 260.

In preferred implementations, the one or more alignment markers realized at the marking step S340 are realized within a predetermined distance from the slanted surface 102 associated with the intersection 260, in the direction of the intersection 260. The predetermined distance is preferably smaller than 100 micrometers, even more preferably smaller than 50 micrometers. This advantageously ensures that the alignment marker can be imaged, and thus be available for alignment purposes, without scanning in an area too far away from the slanted surface 102, thus reducing scanning time. Preferably, in some implementations, the one or more alignment markers realized at the marking step S340 are realized at a location crossing a longitudinal extension of the intersection 260.

In preferred implementations, marking step S340 can comprise realizing one or more alignment markers 150, 250/1-250/6 such that a separation distance 380 between two neighbouring alignment markers 250/3-250/4 is $$D \leq 2 \times h_{MAX}/\tan \phi$$

wherein
D is the separation distance,
$\phi$ is the first angle 131,
$h_{MAX}$ is a maximum tolerable defocusing height 140, 141.

Alternatively, or in addition, in preferred implementations the marking step S340 can comprise realizing one or more alignment markers 150, 250/1-250/6 such that a separation distance 380 between two neighbouring alignment markers 250/3-250/4 is $$D \leq 2 \times \text{ConfDist}$$

wherein
D is the separation distance,
ConfDist is the confidence distance 270.

Thanks to those implementations it can be advantageously ensured that alignment markers 150 are available for a plurality of scans along a plurality of focusing planes 130, 130a, 130b. This advantageously renders it possible to realize the markers 150 without needing to realign the markers 150 in the X direction.

Alternatively, or in addition, in preferred implementations the marking step S340 can comprise realizing one or more alignment markers 150, 250/1-250/6 such that a separation distance 380 between two neighbouring alignment markers 250/3-250/4 is a function of the distance between intersections 260 associated with two successive focusing planes 130, 130a, 130b. For instance, in some examples the separation distance 380 can be a multiple of the distance between intersections 260 associated with two successive focusing planes 130, 130a, 130b. Preferably the multiple can be an integer multiple. This advantageously renders it possible to have a pitch of the alignment markers which is a function of the pitch of the intersections 260.

Alternatively, or in addition, in preferred implementations the marking step S340 can comprise realizing one or more alignment markers 150, 250/1-250/6 according to the condition, among those mentioned before, which results in the shortest separation distance 280.

In some implementations, where a group of milling and respective focusing planes 130, 130a, 130b are implemented in succession, the marking step S340 can comprise realizing one or more alignment markers 150, 250/1-250/6 such that the alignment markers are positioned based on a focusing plane positioned in the middle of the plurality of focusing planes. That is, the focusing planes 130, 130a, 130b can result in a plurality of intersections 260. The intersection positioned in the middle of the plurality of intersections can be used as reference intersection for the group of milling and respective focusing planes 130, 130a, 130b. In this manner, the error introduced by the defocusing for the focusing plane in the middle is minimum, and so is the average error for the remaining focusing planes.

Several such groups of focusing planes 130, 130a, 130b can be defined, with a number of focusing planes 130, 130a, 130b which is a function of the biggest acceptable defocusing. That is, the focusing planes 130, 130a, 130b at the extremities of the group are selected such that the defocusing of the alignment marker when scanning the sample along those planes is within a maximum acceptable defocusing value.

In this manner, it is possible to implement only one alignment marker for each such group of planes, thus reducing the number of alignment markers which need to be implemented.

In preferred implementations, as visible in FIG. 3B, the separation distance 380 between two neighboring alignment markers 150 can be understood to be the distance between the same point of two neighboring markers 250, for instance the center of each of the markers 150, or the leftmost corner, etc. In preferred implementations, the markers 150 can be realized with a constant pitch in the X direction, whereby the pitch is the separation distance 380.

The embodiments above have been described with reference to selection of at least one alignment marker which allows a correct lateral alignment of a given scanning image, taken along a respective focusing plane 130, 130a, 130b. In some cases, it can be sufficient to select a single alignment marker for this purpose.

This is particularly advantageous when the alignment markers are positioned in a manner which is known at the reconstruction of the model of the sample. For instance, in some examples a first image can use alignment marker 230/4 for the alignment and a second image can use alignment marker 230/3 for the alignment. The reconstruction of the model of the sample can be based on a known distance between alignment markers 230/3 and 230/4.

In some preferred implementations, it can be preferable to select at least two alignment markers, preferably positioned at different positions in a direction perpendicular to the intersection 260, for at least two scanning images, and preferably for all scanning images.

Thanks to this latter implementation, a first scanning image can be for instance aligned based on alignment markers 250/4 and 250/5, while a second scanning image can be for instance aligned based on alignment markers 250/3 and 250/4. By selecting at least one marker present in both images, marker 250/4 in this example, the lateral alignment of the images can be achieved based on the common alignment marker. It will be clear that this can be extended to any number of images comprising a common marker.

By selecting more than one marker per scanning image, once one of the two markers is no longer overlapping with neighboring images, the other one might be. For instance, with reference to the example above, a third scanning image can be for instance aligned based on alignment markers 250/2 and 250/3. In this manner, at the second image level, the alignment marker 250/4 can be used for the alignment with the first image, while the alignment marker 250/3 can be used for the alignment with the third image.

This approach has the advantage that the alignment between neighboring images can be achieved through a common alignment marker, thus not requiring any knowledge of the respective position of different markers.

It will be clear to those skilled in the art that, in the context of the description above, the neighboring images can be understood to be scanning images resulting from neighboring focusing planes and/or resulting from neighboring milling steps.

Figure 4:
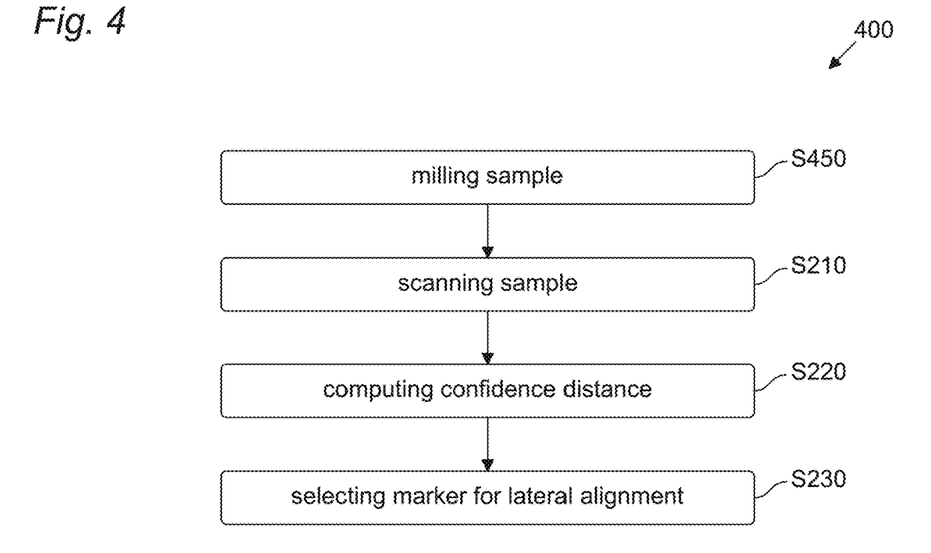
FIG. 4 schematically illustrates a method 400 for measuring a sample 100.

FIG. 4 schematically illustrates a method 400 for measuring a sample 100.

Method 400 differs from method 200 in that it further comprises a step S450 of milling the sample 100 with one or more slanted surfaces 102. Step S450 is preferably carried out before steps S210 and S230, while it can be carried out before or after step S220. Method 400 is therefore particularly advantageous in that it allows the angle 103 to be known, this also enables the angle 131 to be derived therefrom, as previously discussed.

It will be clear that the steps S340 and S450 can be further combined in another method according to an alternative embodiment. This further provides the advantage to configure the slanted surfaces 102 and the markers 150 so as to provide sufficient markers 150 for subsequent alignment while containing processing time.

In preferred implementations, the milling step S450 and the marking step S340 can be implemented with the same component. Preferably this can be achieved by using a focused ion beam or more generally any known milling means (or device). Advantageously, this component can also form part of the microscope, as will be described in the following, so that alignment of the milling means (or device) and of the scanning means (or device) can be carried out only once at the configuration of the microscope. Although the invention has been described above with reference to a method, it will be clear that each method steps can be carried out by a respective means, or device.

Figure 5:
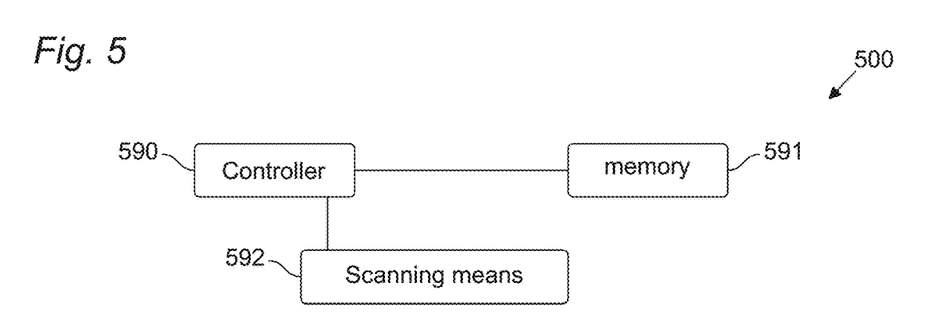
FIG. 5 schematically illustrates elements of a microscope 500.

FIG. 5 schematically illustrates elements of a microscope 500, comprising a controller 590, and a memory 591. The memory 591 can store instructions configured to cause the controller 590 to control the microscope 500 so as to execute the method 200, 300, 400. Moreover, the microscope 500 can further comprise the scanning means 592, such as scanning electron means (or device) or a tip for an atomic force microscope, which can be controlled by the controller 590 in accordance with the steps described for method 200, 300, 400, in particular step S210.

Figure 6:
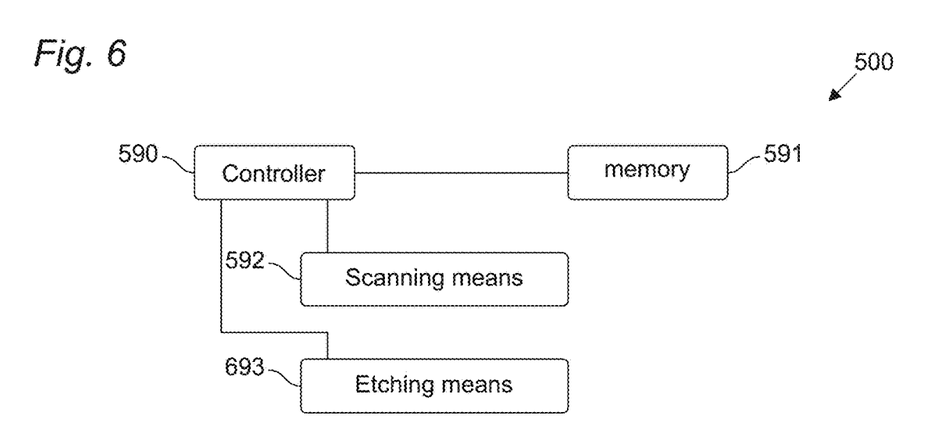
FIG. 6 schematically illustrates elements of a microscope 600.

FIG. 6 schematically illustrates elements of a microscope 600. Microscope 600 differs from microscope 500 due to the additional presence of the milling means (or device) 693. The milling means (or device) can be embodied by any known milling means (or device), for instance a focused ion beam, and can be in particular used to implement steps S340 and S450.

It has thus been described how a microscope and/or a method for controlling a microscope can be used to facilitate the lateral alignment of a plurality of scanning images taken in order to evaluate the internal structure of a sample along its depth. The described embodiments allow in particular the selection of appropriate markers for a precise lateral alignment and/or the efficient realization of markers so as to result in an efficient scanning workflow.

Although the present invention is defined in the attached claims, it should be understood that the present invention can also be defined in accordance with the following embodiments:

Embodiment 1: A method (200, 300, 400) for measuring a sample (100) with a microscope, the method comprising the steps of:
  scanning (S210) the sample (100) using a focusing plane (130) having a first angle (131) with respect to a top surface (101) of the sample (100),
  computing (S220) a confidence distance (270) based on the first angle (131),
  selecting (S230) at least one among a plurality of alignment markers (150, 250/1-250/6) on the sample (100) for performing a lateral alignment of the scanning step (S210) and/or for performing a lateral alignment of an output of the scanning step (S210),
  wherein the at least one alignment marker (250/3, 250/4) selected at the selecting step (S230) is chosen among the alignment markers (150, 250/1-250/6) placed within the confidence distance (270) from an intersection (260) of the focusing plane (130) with the top surface (101).

Embodiment 2: The method (200, 300, 400) according to embodiment 1,
  wherein the first angle (131) is bigger than 5 degrees, preferably bigger than 15 degrees, and/or smaller than 70 degrees, preferably smaller than 50 degrees.

Embodiment 3: The method (200, 300, 400) according to embodiment 1 or 2,
  wherein the sample (100) comprises at least a region with a slanted surface (102), the slanted surface (102) having a second angle (103) with respect to the top surface (101),
  wherein the first angle (131) and the second angle (103) differ for at most 10 degrees and/or 10%.

Embodiment 4: The method (200, 300, 400) according to any of embodiments 1 to 3,
  wherein the confidence distance (270) is measured in a direction perpendicular to the intersection (260).

Embodiment 5: The method (200, 300, 400) according to any of embodiments 1 to 4,
  wherein the confidence distance (270) is measured in a direction parallel to the top surface (101).

Embodiment 6: The method (200, 300, 400) according to any of embodiments 1 to 5,
  wherein the step of computing (S220) the confidence distance (270) is based on a maximum tolerable defocusing value.

Embodiment 7: The method (200, 300, 400) according to embodiment 6,
  wherein the maximum tolerable defocusing value is a maximum tolerable defocusing height (140, 141).

Embodiment 8: The method (300) according to any of embodiments 1 to 7,
  wherein the step of computing (S220) comprises computing $ConfDist = f(\phi)$ wherein
  $\phi$ is the first angle (131),
  ConfDist is the confidence distance (270),
  f is a function which increases as $\phi$ decreases.

Embodiment 9: The method (300) according to any of embodiments 1 to 8, further comprising the step of
  marking (S340) the sample (100) with one or more alignment markers (150, 250/1-250/6).

Embodiment 10: The method (300) according to embodiment 9,
wherein the marking step (S340) comprises realizing one or more alignment markers (150, 250/1-250/6) within the confidence distance (270) from the intersection (260).

Embodiment 11: The method (300) according to embodiment 9,
wherein the marking step (S340) comprises realizing one or more alignment markers (150, 250/1-250/6) such that a separation distance (380) between two neighbouring alignment markers (250/3-250/4) is $$D \leq 2 \times h_{MAX}/\tan(\phi)$$

wherein
D is the separation distance,
$\phi$ is the first angle (131),
$h_{MAX}$ is a maximum tolerable defocusing height (140, 141).

Embodiment 12: The method (300) according to embodiment 9,
wherein the marking step (S340) comprises realizing one or more alignment markers (150, 250/1-250/6) such that a separation distance (380) between two neighbouring alignment markers (250/3-250/4) is $$D \leq 2 \times \text{ConfDist}$$

wherein
D is the separation distance,
ConfDist is the confidence distance (270).

Embodiment 13: The method (400) according to any of embodiments 1 to 12, further comprising the step of
milling (S450) the sample (100) so as to realize one or more slanted surfaces (102) in the sample (100).

Embodiment 14: The method (300, 400) according to embodiment 13 in combination with any of embodiments 9 to 12, wherein the milling step (S450) and the marking step (S340) are implemented with the same component (110, 693).

Embodiment 15: A microscope (500, 600) comprising
a controller (590), and
a memory (591),
wherein the memory (591) stores instructions configured to cause the controller (590) to control the microscope (500, 600) so as to execute the method (200, 300, 400) according to any of embodiments 1 to 14.

Embodiment 16: A software product for a microscope (500, 600), the product comprising instructions configured to cause a controller (590) to control the microscope (500, 600) so as to execute the method (200, 300, 400) according to any of embodiments 1 to 14. Although the invention has been shown and described with respect to certain preferred embodiments, equivalents and modifications will occur to others skilled in the art upon the reading and understanding of the specification. The present invention includes all such equivalents and modifications and is limited only by the scope of the appended claims.

LIST OF REFERENCE NUMERALS

100: sample
101: top surface
102, 102a: slanted surface
103: angle
110: milling beam
120: imaging beam
130, 130a, 130b: focusing plane
131: angle
140, 141: defocusing height
150, 250/1-250/6: alignment marker
200: method for measuring a sample
S210: scanning step
S220: computing distance
S230: selecting step
250/1-250/6: alignment marker
260: intersection
270: confidence distance
300: method for measuring a sample
S340: marking step
380: separation distance
400: method for measuring a sample
S450: milling step
500: microscope
590: CPU
591: memory
592: scanning means
600: microscope
693: milling means

What is claimed is:

1. A method for measuring a sample with a microscope, the method comprising the steps of:
   scanning the sample using a charged particle beam focused at a focusing plane having a first angle with respect to a top surface of the sample,
   computing a confidence distance based on the first angle,
   selecting at least one among a plurality of alignment markers on the sample for performing a lateral alignment of the scanning step and/or for performing a lateral alignment of an output of the scanning step,
   wherein the at least one alignment marker selected at the selecting step is chosen among the alignment markers placed within the confidence distance from an intersection of the focusing plane with the top surface.

2. The method of claim 1, wherein the first angle is bigger than 5 degrees, and/or smaller than 70 degrees.

3. The method of claim 1,
   wherein the sample comprises at least a region with a slanted surface, the slanted surface having a second angle with respect to the top surface,
   wherein the first angle and the second angle differ for at most 10 degrees and/or 10%.

4. The method of claim 1,
   wherein the confidence distance is measured in a direction perpendicular to the intersection.

5. The method of claim 1,
   wherein the confidence distance is measured in a direction parallel to the top surface.

6. The method of claim 1,
   wherein the step of computing the confidence distance is based on a maximum tolerable defocusing value.

7. The method of claim 6,
   wherein the maximum tolerable defocusing value is a maximum tolerable defocusing height.

8. The method of claim 1,
   wherein the step of computing comprises computing $$\text{ConfDist} = f(\phi)$$

wherein
$\phi$ is the first angle,
ConfDist is the confidence distance,
f is a function which increases as $\phi$ decreases.

9. The method of claim 1, further comprising the step of marking the sample with one or more alignment markers.

10. The method of claim 9,
wherein the marking step comprises realizing one or more alignment markers within the confidence distance from the intersection.

11. The method of claim 9,
wherein the marking step comprises realizing one or more alignment markers such that a separation distance between two neighbouring alignment markers is $$D \leq 2 \times h_{MAX}/\tan(\phi)$$

wherein
D is the separation distance
$\phi$ is the first angle,
$h_{MAX}$ is a maximum tolerable defocusing height.

12. The method of claim 9,
wherein the marking step comprises realizing one or more alignment markers such that a separation distance between two neighbouring alignment markers is $$D \leq 2 \times \text{ConfDist}$$

wherein
D is the separation distance,
ConfDist is the confidence distance.

13. The method of claim 1, further comprising the step of milling the sample so as to realize one or more slanted surfaces in the sample.

14. The method of claim 13, further comprising the step of marking the sample with one or more alignment markers, wherein the milling step and the marking step are implemented with the same component.

15. A microscope comprising
a controller, and
a memory,
wherein the memory stores instructions configured to cause the controller to control the microscope so as to execute the method of claim 1.

16. A software product for a microscope, the product comprising instructions configured to cause a controller to control the microscope so as to execute the method of claim 1.

17. The microscope of claim 15, wherein the first angle is bigger than 5 degrees, and/or smaller than 70 degrees.

18. The microscope of claim 15, wherein the sample comprises at least a region with a slanted surface, the slanted surface having a second angle with respect to the top surface,
wherein the first angle and the second angle differ for at most 10 degrees and/or 10%.

19. The microscope of claim 15, wherein the confidence distance is measured in a direction perpendicular to the intersection.

20. The microscope of claim 15, wherein the confidence distance is measured in a direction parallel to the top surface.

21. A method for measuring a sample with a microscope that has a focusing plane, the method comprising the steps of:
positioning the sample relative to the microscope such that the focusing plane has a first angle with respect to a top surface of the sample,
scanning the sample using the microscope with the focusing plane having the first angle with respect to the top surface of the sample,
computing a confidence distance based on the first angle, and
selecting at least one among a plurality of alignment markers on the sample for performing a lateral alignment of the scanning step and/or for performing a lateral alignment of an output of the scanning step,
wherein the at least one alignment marker selected at the selecting step is chosen among the alignment markers placed within the confidence distance from an intersection of the focusing plane with the top surface.

22. The method of claim 21, wherein the microscope comprises an atomic force microscope.

23. The method of claim 1, wherein the microscope comprises a scanning electron microscope or a helium-ion microscope.

24. The method of claim 2, wherein the first angle is at least one of (i) bigger than 15 degrees, or (ii) smaller than 50 degrees.

25. The microscope of claim 17, wherein the first angle is at least one of (i) bigger than 15 degrees, or (ii) smaller than 50 degrees.

* * * * *